(12) United States Patent
Wiley (10) Patent No.: US 6,512,673 B1
(45) Date of Patent: Jan. 28, 2003

(54) LOW PROFILE EQUIPMENT HOUSING WITH ANGULAR FAN

(75) Inventor: Robert Wiley, Topsfield, MA (US)

(73) Assignee: Network Engines, Inc., Canton, MA (US)

(*) Notice: Subject to any disclaimer, the term of this patent is extended or adjusted under 35 U.S.C. 154(b) by 0 days.

(21) Appl. No.: 09/899,762

(22) Filed: Jul. 5, 2001

Related U.S. Application Data

(60) Provisional application No. 60/216,055, filed on Jul. 5, 2000, provisional application No. 60/215,952, filed on Jul. 5, 2000, provisional application No. 60/215,997, filed on Jul. 5, 2000, provisional application No. 60/215,996, filed on Jul. 5, 2000, provisional application No. 60/215,995, filed on Jul. 5, 2000, and provisional application No. 60/244,361, filed on Oct. 30, 2000.

(51) Int. Cl.[7] .............................................. H05V 7/20
(52) U.S. Cl. .................. 361/695; 361/688; 361/689; 361/690; 361/694; 257/714; 257/706; 174/16.1; 174/16.3; 165/80.3; 165/185
(58) Field of Search .............................. 361/687–690, 361/694–700, 702, 704, 709; 257/722; 174/16.3; 165/80.3, 185, 122; 454/184

(56) References Cited

U.S. PATENT DOCUMENTS

| | | | | |
|---|---|---|---|---|
| 5,440,450 A | * | 8/1995 | Lau et al. | 361/695 |
| 6,034,870 A | * | 3/2000 | Osborn et al. | 361/690 |
| 6,049,455 A | * | 4/2000 | Nakamura et al. | 361/688 |
| 6,064,571 A | * | 5/2000 | Noble | 361/695 |
| 6,081,423 A | * | 6/2000 | Griffin | 361/688 |
| 6,173,576 B1 | * | 1/2001 | Ishida et al. | 62/3.7 |
| 6,215,659 B1 | * | 4/2001 | Chen | 361/695 |
| 6,244,331 B1 | * | 6/2001 | Budelman | 165/80.3 |

* cited by examiner

*Primary Examiner*—Boris Chervinsky
(74) *Attorney, Agent, or Firm*—David J. Powsner; Nutter McClennen & Fish LLP (57) ABSTRACT

The present invention is directed to ventilating or cooling element for airflow cooling in a digital data processing apparatus, and it is particularly suited to such apparatus having a high circuit density, or mounted within a restricted chassis or housing, such as the housing of a web server, or of a storage array device for a network server or web server. The cooling element includes a fan that is disposed at an angle to integrate its cooling air with general circulation or air flow through the chassis. The element may mount on a plate, such as the thermally conductive plate of a heat sink, that is adapted for coupling to the chassis and/or contacting a microprocessor chip, and a fan is disposed on the mounting plate at an angle to cool the plate or chip without creating obstructive cross wind. The mounting plate can be disposed within the middle portion of the chassis. The fan or cooling element can be angled so as to direct airflow towards at least a selected portion of the chassis, e.g. along a flow path to a chassis vent or opening, which may be in the rear portion. The mounting plate can also include one or more a thermally conductive heat dissipation members, such as fins or posts, and the fan may have a side-to-side tilt as well as an inclination with respect to the plane of the plate.

9 Claims, 5 Drawing Sheets

LOW PROFILE EQUIPMENT HOUSING WITH ANGULAR FAN

CROSS-REFERENCE TO RELATED APPLICATIONS

This application claims priority from earlier filed U.S. provisional patent application Serial No. 60/216,055, filed Jul. 5, 2000, which is incorporated herein by reference.

This application is related to the following co-pending, commonly assigned applications, the teachings of all of which are incorporated herein by reference: U.S. Serial No. 60/215,952, filed Jul. 5, 2000, entitled "Server Architecture and Methods for Digital Data Processing," U.S. Serial No. 60/215,975, filed Jul. 5, 2000, entitled "Low Profile, High Density Storage Array," U.S. Serial No. 60/215,997, filed Jul. 5, 2000, entitled "Ventilating Slide Rail Mount," U.S. Serial No. 60/215,996, filed Jul. 5, 2000, entitled "Power Supply for Low Profile Equipment Housing," U.S. Serial No. 60/215,995, filed Jul. 5, 2000, entitled "Circuit Board Riser," U.S. Serial No. 60/244,354, filed Oct. 30, 2000, entitled "Ventilating Slide Rail Mount," and U.S. Serial No. 60/244,361, filed Oct. 30, 2000, entitled "Low Profile, High Density Storage Array."

BACKGROUND OF THE INVENTION

The present invention relates to digital data processors, and, in particular, to methods and apparatus for cooling components within a digital data processor or ancillary device. The invention has particular application in compact, "low profile" devices where space is at a premium, airflow paths are restricted and overheating is of concern.

Heating is a constant and significant problem in digital data processors. The failure rates of many electronic components increase as operating temperatures rise. This is particularly true of central processing units which, themselves, often generate significant heat. The problem is compounded by the use of more densely packed circuit boards, by faster processor chips, and by the large power supplies needed to support the foregoing.

Most often, processors and associated components are cooled by airflow. Fans are typically used to push or pull air from one side of a chassis, across the components, and out the other side of the chassis. Thus, for example, a typical digital data processor includes chassis intake and/or exhaust fans, often with a fan on the central processing unit itself. While the steps of simply providing intake and exhaust fans on a chassis or housing wall, and of providing one or more device fans on critical components, have proven adequate to date, there remains a need to provide for the cooling of even more powerful, and/or more compact systems.

One object of the present invention is to provide an improved digital data processor apparatus and methods.

A more particular object is to provide such apparatus and methods for cooling components of digital data processors.

A more particular object is to provide such apparatus and methods as are particularly adapted to cooling an integrated circuit chip element, such as a central processing unit, utilized in digital data processing apparatus.

A still further object of the invention is to provide such apparatus and methods as are adapted for use with web servers and other data processing apparatus that are housed in restricted space, are compact of design and/or are intolerant of overheating.

A still further object is to provide such apparatus and methods as can be implemented at low cost.

A still further object of the invention is to provide such apparatus and methods as can be adapted or retrofitted to pre-existing equipment, as well as designed for use in new equipment.

SUMMARY OF THE INVENTION

One or more of the foregoing objects are achieved in accordance with the present invention by a ventilating or cooling device that includes a fan adapted to mount within a housing, such as the housing or chassis of a web server or storage array, and to selectively cool one or more components disposed on a circuit board or chip carrier within the housing. A flow of air may be provided though the housing for general circulation and cooling, and the fan is positioned obliquely to redirect air toward or away from the selected component while maintaining, establishing or reinforcing a flow of air toward other components or along a path to the housing exhaust. The angle of the fan thus integrates the cooling air for the component in the region around the selected component into an airflow pattern through the chassis. By introducing a locally angled flow path, the fan avoids creation of turbulence or a cross-directed wind that would block overall chassis air flow, create back pressure or otherwise diminish the achievable cooling of the chassis components and the device as a whole.

In one embodiment the fan may be a muffin fan formed with an integral housing defining a plane of rotation for the fan blade, and mounted so that the fan blade lies at an oblique angle with respect to plane of the underlying circuit board or a component mounted on the board. In other embodiments the fan may mount with an inclination that introduces a downward component of airflow velocity, and/or a side-to-side tilt that directs the stream somewhat to the left or right to define a desired flow pattern within the chassis and around the components mounted in a housing. A particular embodiment mounts at a shallow angle to fit within a broad covered housing or chassis unit of low height, such as a web server or storage array device that mounts in a rack and that is densely populated with many circuit boards and/or other electronic components. The angle of the fan is tilted out of the horizontal plane to place its inlet facing the upstream or cooling inlet side of the housing, such that the air propelled by the fan has components of motion in both downward (toward the component) and downstream (toward an outlet) directions. For a chassis having an air inlet at the front, the fan maintains the coolant flow generally toward the rear of the housing, where vents and/or an outlet fan operate to maintain a suitable flow gradient over all devices in the housing. The angle of the fan may be defined by an integral mounting structure such as angled side plates formed in the exterior portion of the fan framework, or the oblique mounting angle may be achieved by using separate posts, angled mounting plates or other chassis attachments to define the position and orientation of the fan as a whole.

In yet further embodiments, the fan may possess an outer frame configured to provide a housing or shroud around the component which is to be cooled, and may have louvers or vents along one side of the shroud to define a desired downstream or side-diverted airflow directionality that integrates into the general circulation through the chassis.

The fan may be mounted on a heat sink having a conventional structure, such as a thermally conductive plate having a central flat region, and carrying a plurality of heat-dissipating fins or posts.

In accordance with further aspects of the invention, there is provided a component such as a web server in a chassis or housing for use in a digital data processing system. The component has one or more fans that define cooling airflow through the chassis, and includes a circuit element, such as a central processing unit, and an oblique fan as described above that cools the circuit element while integrating its stream into the chassis airflow. The fan may mount on a heat sink and introduce its downstream outflow into an airstream that has been somewhat straightened or blocked by fins of the heat sink, thus reinforcing or enhancing the overall chassis cooling.

The aforementioned objects are met by the present invention which provides, in one aspect, a cooling element for components within a digital data processor chassis. The cooling element, a fan or other device for actively inducing airflow, is disposed on or near the component to be cooled. It is disposed at an angle to facilitate a flow of air past the component and into an air stream established in the chassis.

Further aspects of the invention provide a cooling element (e.g., angled fan) as described above that includes a mounting plate to facilitate mounting the fan on the component being cooled.

Still further aspects of the invention include a mounting plate to mount the cooling element on the component.

In another aspect of the invention, a component is disposed within the rear portion of a chassis having a front, middle, and rear portion. The fan is angled toward the rear portion so as to direct airflow towards the component.

These and other aspects of the invention are evident in the drawings and in the descriptions that follow.

BRIEF DESCRIPTION OF THE DRAWINGS

The invention will be more fully understood from the following detailed description taken in conjunction with the accompanying drawings, in which.

DETAILED DESCRIPTION OF THE DRAWINGS

Figure 1:
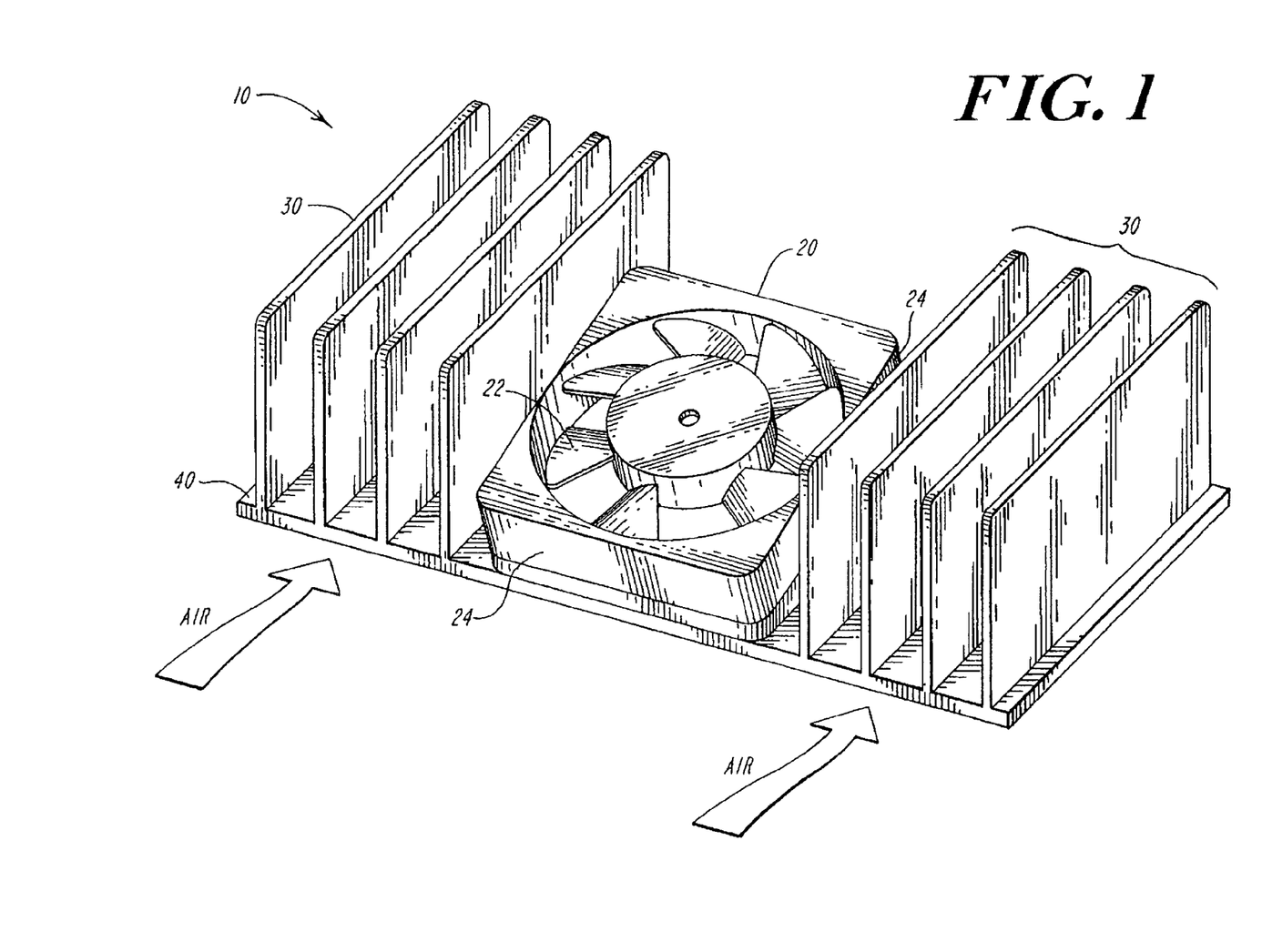
FIG. 1 depicts a cooling element in accordance with the present invention.

As shown in FIG. 1, a cooling assembly 10 of the present invention has a cooling element 20, illustratively mounted on a heat sink comprised of a mounting plate 40 and a plurality of heat conductive heat dissipation members, fins 30. The cooling element 20 includes a fan 22 for directing airflow, and a fan mounting 24 that orients and supports the fan, as discussed further below. The heat sink mounting plate 40 can be used to mount the cooling assembly 10 of the present invention in a digital data processor, and typically a heat generating component such as a microprocessor (not shown) mounts on the plate 40 so as to be cooled. In accordance with a principal aspect of the present invention, the fan 22 departs from the parallel/orthogonal mounting geometry of the prior art, and is disposed over the mounting plate 40 at an oblique angle so as to facilitate the flow of air within the chassis, i.e., to integrate its airflow with the direction of circulation toward the exhaust or air outlet(s) of the chassis. Preferably the fan 22 is positioned relative to the component so as to cool the microprocessor, which as described below, is typically mounted on the heat sink but may, in various embodiments be shifted upstream or downstream with respect to the fan 22.

The conductive heat dissipation members 30 of the heat sink can be a plurality of spaced apart fins (as shown), a plurality of posts (not shown), or other conductive members which act to draw away and dissipate heat from component mounted on the plate 40 within a digital data processor. Advantageously, by integrating the component cooling air with the chassis airflow, the fan avoids creating flow-obstructing cross-drafts, and directs its stream such that downstream components are also cooled.

Figure 2:
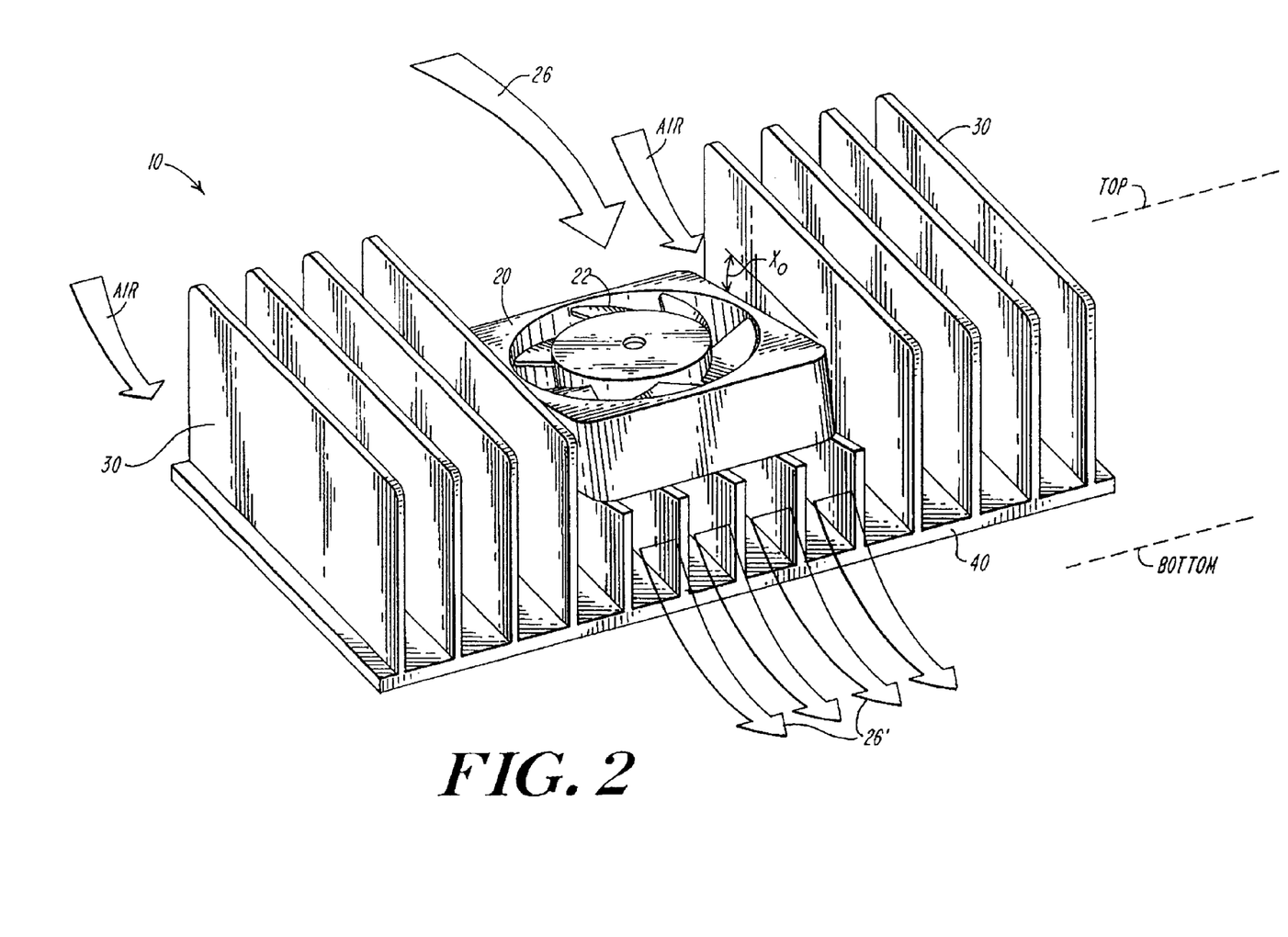
FIG. 2 depicts a rear-view of a preferred embodiment of the cooling-element of the present invention.

FIG. 2 depicts a rear-view of the cooling component 10 of a preferred embodiment of the present invention. The cooling component 10 is shown having a cooling element 20 with a fan 22 and fan mounting 24, the cooling element 20 being disposed on a heat sink mounting plate 40 with a plurality of spaced apart fins 30. The cooling element 20 is shown disposed at an oblique angle $X_0$ from the horizontal mounting plate 40. The angle can be in the range of 0.01° to slightly under 90°, and typically in the range of about 10° to about 45°. An angle of 14° was found suitable for mounting in a covered chassis having a height somewhat under two inches, and the angled fan was found to enhance airflow, allowing a standard muffin fan to have at least a portion of its intake positioned further from the cover, and to form an oblique airflow such that substantially all the incoming air, represented by arrows 26 in the Figure, was directed as an outflow 26' toward the back of the chassis rather than forming turbulent cross flow components. Thus, the angled mounting allowed the normal front-to back airflow to feed directly into the fan, which, moreover was positioned further from the cover or top of the chassis. Thus a freer intake was achieved, and the fan did not have to work against the lowered pressure of airflow orthogonal to its inlet. The downstream outflow was directed toward the back of the chassis rather than transversely, preventing obstructive flow or air stagnation, while the rather slight acute angle still delivered substantial cooling directed at a microprocessor chip mounted on the heat sink below the fan. One skilled in the art will appreciate that the fan can be angled more steeply, in which case it may desirable to position the cooled component, e.g., microprocessor chip, further downstream in the major flow of the fan, rather than mounting it below the fan. In either case, the angled component fan produces a more coherent downstream flow so as to integrate its airflow to cool downstream components within the chassis.

Figure 3:
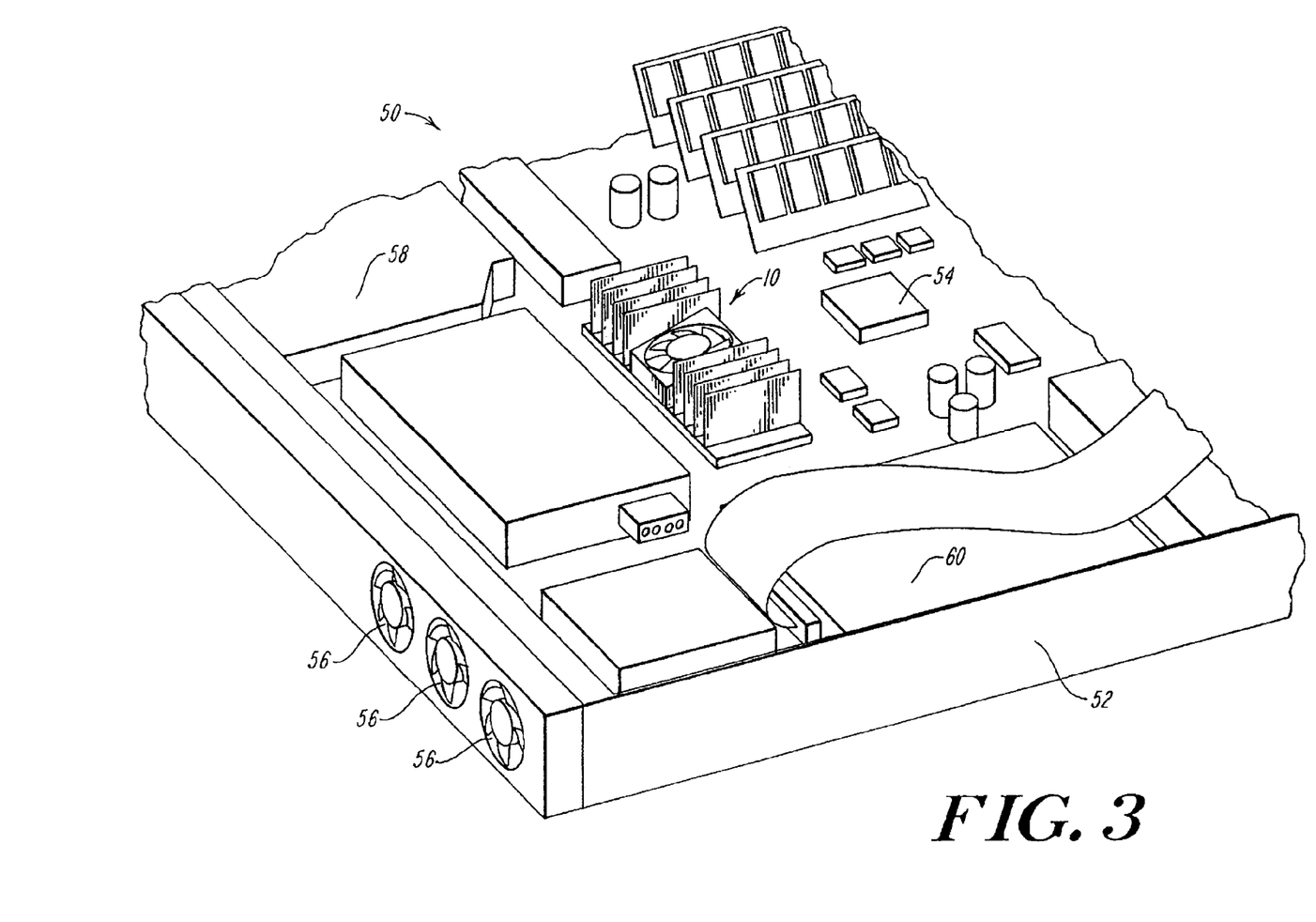
FIG. 3 depicts a digital data processor chassis and circuit assembly having a cooling element in accordance with the present invention.

FIG. 3 illustrates a digital data processor 50 having a chassis 52 with a cooling assembly of the present invention mounted therein. Four intake fans 56 are provided near the front of the chassis 52 for providing air into the chassis 52. A power supply 58, processing unit 54 such as a RISC control chip, and other components 60 such as disk drives are all disposed within the chassis 52, which, it will be appreciated, is normally closed and covered, so that it has the shape of a broad, flat box of small height. The cooling component 10 of the present invention is also disposed within the chassis 52. The cooling component 10 is angled that it directs airflow from the front to a direction downwardly and back, so as to provide airflow toward the processing unit 54 and downstream components while also cooling the CPU (not shown) mounted on the heat sink.

Figure 4:
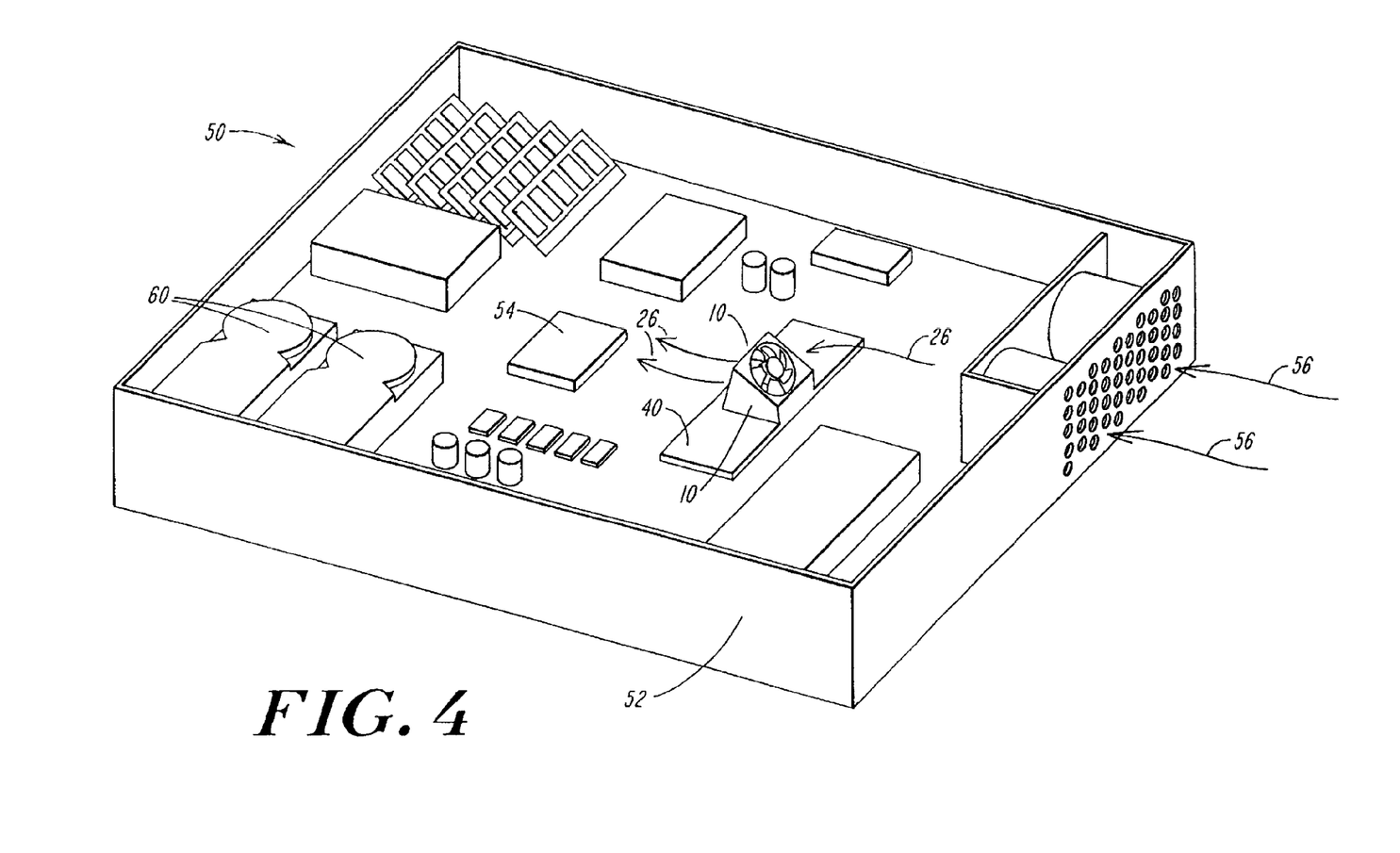
FIG. 4 depicts another digital data processor having the cooling component of the present invention.

FIG. 4 is a side perspective view of a digital data processor 50 housed in a chassis 52 with the cooling assembly 10 of the present invention. The cooling component 10 is tilted with respect to the horizontal plane so as to provide airflow toward downstream components such as a processing unit 54 and components 60. The direction of airflow is shown by the arrows 26. Two intake fans 56 are illustrated drawing air into the chassis 52 to establish a general flow toward openings or vents (not shown) at or toward the rear of the chassis.

Figure 5:
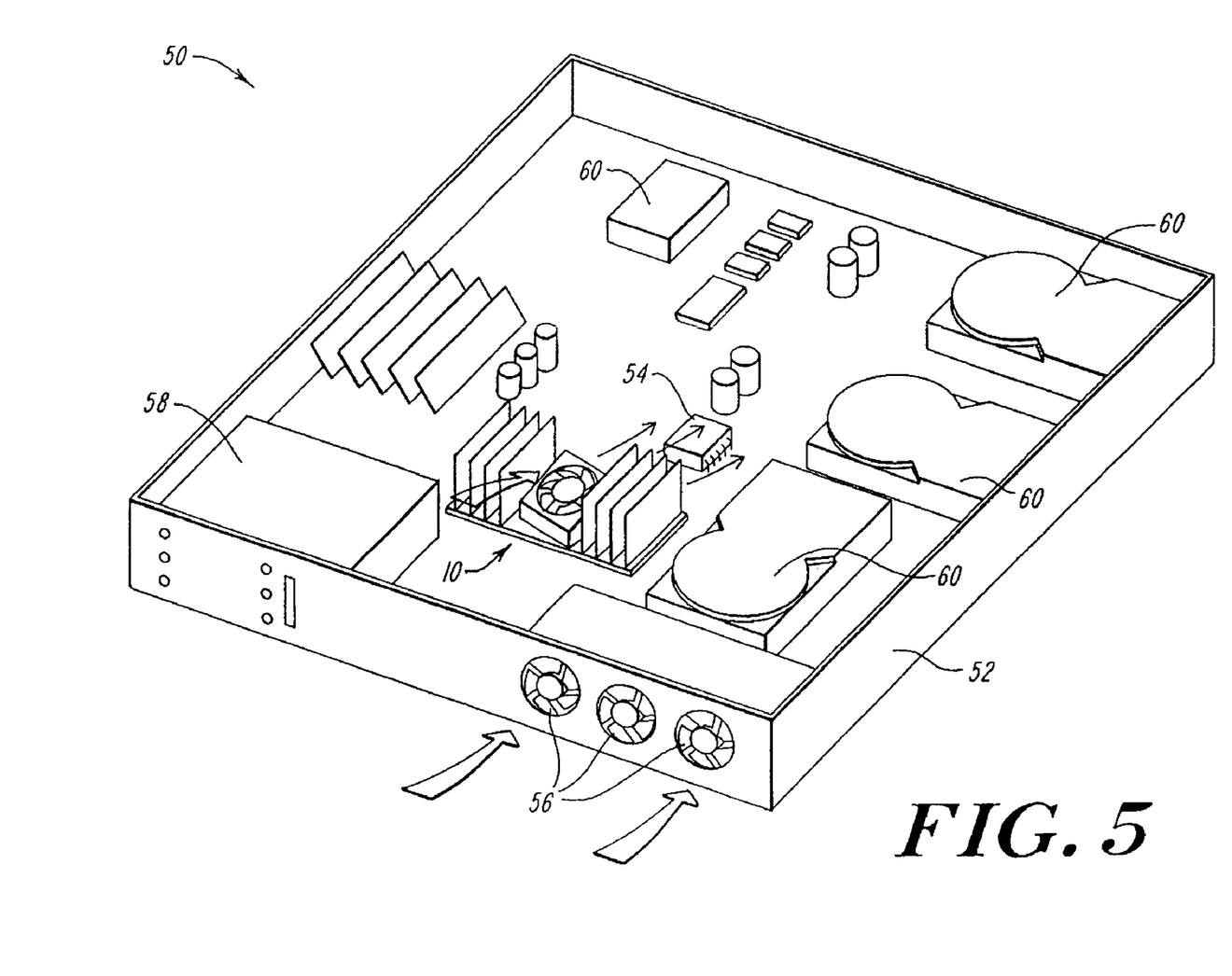
FIG. 5 is yet another view of the digital data processor of FIGS. 3 and 4 having the cooling component of the present invention.

FIG. 5 is yet another digital data processor 50 having the cooling component 10 of the present invention. Three intake fans 56 are shown for supplying air to the chassis 52. In other high-density microprocessor apparatus, such as rack-mounted storage arrays, six or more intake fans may be provided symmetrically positioned on the front panel, and further fans may be mounted on the back panel to enhance outflow. In the embodiment shown in FIG. 5, the fan of cooling component 10 is tilted with respect to the horizontal, and also canted from left to right so that its output draft is directed both back and toward the right. This configuration may be useful to channel airflow to one side where heat-sensitive components reside, to divert airflow around an obstructing but not heat-sensitive component, or simply to re-integrate airflow for more efficient flow toward the exhaust ports of the chassis. Thus, for example when the processor device comprises an array of many large components such as disk drives, that define corridors or a lattice pattern of flow obstruction within the chassis, the angle fan mounting of the present invention may include a lateral tilt to integrate the cooling flow with the chassis circulation. It will be appreciated that several of these cooling assemblies 10 may be disposed within the chassis 52 for directing airflow, and these may be arranged to divert or combine flows. The cooling assembly 10 of FIG. 5 is shown directing airflow toward a processor chip 54 and other circuitry.

Various commonly-owned inventive methods and apparatus have been developed to enhance heat dissipation or cooling mechanisms in densely arrayed web server equipment, and these provide a range of architectures and constructions to which the present invention is advantageously applied. For example, co-pending, commonly assigned, U.S. Patent application Serial No. 60/215,997, filed Jul. 5, 2000, and Serial No. 60/244,354, filed Oct. 30, 2000, both entitled "Ventilating Slide Rail Mount" describe ventilated slide rail constructions which facilitates the flow of air throughout the chassis. Another commonly owned invention is a high density storage array having a plurality of digital data storage devices and supporting elements for supporting the storage devices and for providing additional airflow space (see commonly assigned, co-pending U.S. Patent application Serial No. 60/215,975 filed Jul. 5, 2000, and Serial No. 60/244,361, filed Oct. 30, 2000, both entitled "Low Profile, High Density Storage Array"). Another is an equipment housing offering improved physical layout and circuit connections (see commonly assigned, copending U.S. patent application Serial No. 60/215,996 filed Jul. 5, 2000, entitled "Power Supply for Low Profile Equipment Housing"). Another is a circuit board riser which among other attributes, occupies less space, thereby providing additional space for airflow to travel (see commonly assigned, co-pending U.S. patent application Serial No. 60/215,995 filed Jul. 5, 2000, entitled "Circuit Board Riser.") Another commonly owned U.S. patent application, Serial No. 60/215,952, filed Jul. 5, 2000, entitled "Server Architecture and Methods for Digital Data Processing," describes a unique architecture for server systems and the monitoring of physical or utilization status. Each of the foregoing constructions is advantageously employed in a system of the present invention and the invention described herein further provides additional cooling benefits in the chassis, allowing for the cooling of such densely packed, and more compact systems, and is compatible with, or extends each of the above inventions, the patent applications of which are all hereby incorporated by reference.

Illustrative embodiments of the invention being thus described, variations, modifications and adaptations to various processing devices and chassis configurations will occur to those skilled in the art, and these are considered to be within the spirit and scope of the invention. Accordingly, the invention is not to be limited by what has been particularly shown and described, but is understood to encompass such variations, modifications and adaptations as will occur to those skilled in the art, as defined by the claims appended hereto and equivalents thereof.

All publications and references cited herein are expressly incorporated herein by reference in their entirety.

What is claimed is:

1. A digital data processor comprising a chassis, a circuit component disposed in the chassis, any of an intake fan and an exhaust fan (collectively, "intake fan") that is disposed on or in the chassis and that provides cooling airflow within chassis, a cooling element for cooling at least the circuit component, the cooling element comprising
a heat sink that is mounted on the component and
a fan that is mounted on the heat sink, the fan being disposed at an oblique angle relative to a plane of the component such that allow generated by the fan is integrated with cooling airflow provided in the chassis by the intake fan.

2. The digital data processor of claim 1, wherein the chassis has a front portion, a middle portion, and a rear portion, the intake fan provides cooling air-flow within the chassis that circulates in a direction of the rear portion of the chassis, and the fan of the cooling element is angled to also generate airflow in the direction of the rear portion of the chassis.

3. The digital data processor of claim 1, wherein the fan of the cooling element is angled such that airflow generated by it is channeled any of (i) to heat-sensitive components or (ii) to divert airflow around an obstructing component.

4. The digital data processor of claim 1, wherein the heat sink comprises at least one thermally conductive heat dissipation member disposed on a mounting plate.

5. The digital data processor of claim 4, wherein the at least one conductive member comprises a plurality of spaced apart fins.

6. The digital data processor of claim 4, wherein at least one conductive member comprises a plurality of spaced apart posts.

7. A cooling element for use in a digital data processor apparatus, the cooling element comprising:

a thermally conductive mounting plate for mounting on a circuit component of the digital data processing system;

a fan disposed on the mounting plate, the fan being disposed at an oblique angle relative to a plane of the mounting plate such that air flow generated by the fan is integrated with a direction of cooling airflow within a chassis of the digital data processor apparatus in which the circuit component is disposed, a plurality of thermally conductive heat dissipation members disposed on a mounting plate.

8. The cooling element of claim 7, wherein the heat dissipation members comprise a plurality of spaced apart fins.

9. The cooling element of claim 7, wherein the heat dissipation members comprise a plurality of spaced apart posts.

* * * * *

UNITED STATES PATENT AND TRADEMARK OFFICE
CERTIFICATE OF CORRECTION

PATENT NO.    : 6,512,673 B1
DATED         : January 28, 2003
INVENTOR(S)   : Robert Wiley It is certified that error appears in the above-identified patent and that said Letters Patent is hereby corrected as shown below:

Column 6,
Line 26, following the words "airflow within"; please insert -- the --.
Line 55, following the words "claim 4, wherein"; please insert -- the --.

Signed and Sealed this

Twenty-ninth Day of July, 2003

JAMES E. ROGAN
*Director of the United States Patent and Trademark Office*